United States Patent
Lei et al.

(10) Patent No.: US 12,533,709 B2
(45) Date of Patent: *Jan. 27, 2026

(54) SILACYCLIC COMPOUNDS AND METHODS FOR DEPOSITING SILICON-CONTAINING FILMS USING SAME

(71) Applicant: Versum Materials US, LLC, Tempe, AZ (US)

(72) Inventors: Xinjian Lei, Vista, CA (US); Robert Gordon Ridgeway, Chandler, AZ (US); Raymond Nicholas Vrtis, Carlsbad, CA (US)

(73) Assignee: Versum Materials US, LLC, Tempe, AZ (US)

( * ) Notice: Subject to any disclaimer, the term of this patent is extended or adjusted under 35 U.S.C. 154(b) by 639 days.

This patent is subject to a terminal disclaimer.

(21) Appl. No.: 17/370,957

(22) Filed: Jul. 8, 2021

(65) Prior Publication Data
US 2021/0339280 A1 Nov. 4, 2021

Related U.S. Application Data

(62) Division of application No. 16/170,152, filed on Oct. 25, 2018, now abandoned.

(60) Provisional application No. 62/578,072, filed on Oct. 27, 2017.

(51) Int. Cl.
| | |
|---|---|
| *B05D 1/00* | (2006.01) |
| *B05D 3/02* | (2006.01) |
| *B05D 3/06* | (2006.01) |
| *C23C 16/30* | (2006.01) |
| *C23C 16/50* | (2006.01) |
| *C23C 16/56* | (2006.01) |
| *H01B 3/46* | (2006.01) |
| *H01L 21/02* | (2006.01) |

(52) U.S. Cl.
CPC ............... *B05D 1/60* (2013.01); *B05D 1/62* (2013.01); *B05D 3/0254* (2013.01); *B05D 3/067* (2013.01); *C23C 16/30* (2013.01); *C23C 16/50* (2013.01); *C23C 16/56* (2013.01); *H01B 3/46* (2013.01); *H01L 21/02126* (2013.01); *H01L 21/02203* (2013.01); *H01L 21/02216* (2013.01); *H01L 21/02274* (2013.01); *H01L 21/02348* (2013.01)

(58) Field of Classification Search
CPC ............... B05D 1/60; H01L 21/02211; H01L 21/02216; H01B 3/46; C23C 16/401
See application file for complete search history.

(56) References Cited

U.S. PATENT DOCUMENTS

| | | | |
|---|---|---|---|
| 4,965,367 A | * | 10/1990 | Baney .................. C07F 7/1804 556/406 |
| 6,054,206 A | | 4/2000 | Mountsier |
| 6,171,945 B1 | | 1/2001 | Mandal et al. |
| 6,238,751 B1 | | 5/2001 | Mountsier |
| 6,312,793 B1 | | 11/2001 | Grill et al. |
| 8,753,985 B2 | | 6/2014 | Underwood et al. |
| 9,922,818 B2 | * | 3/2018 | Vrtis ................. H01L 21/02216 |
| 10,395,920 B2 | * | 8/2019 | Vrtis ................. H01L 21/02216 |
| 2002/0142579 A1 | | 10/2002 | Vincent et al. |
| 2004/0048960 A1 | * | 3/2004 | Peterson .......... H01L 21/02126 257/E21.261 |
| 2004/0175957 A1 | | 9/2004 | Lukas et al. |
| 2007/0299239 A1 | | 12/2007 | Weigel et al. |
| 2012/0282415 A1 | | 11/2012 | Vrtis et al. |
| 2015/0364321 A1 | * | 12/2015 | Vrtis ................. H01L 21/02274 438/759 |

FOREIGN PATENT DOCUMENTS

| | | | |
|---|---|---|---|
| EP | 1037275 A1 | 9/2000 | |
| EP | 1119035 A2 | 7/2001 | |
| GB | 2009193 A | * 6/1979 | ............ C07F 7/1804 |
| TW | 201923135 A | 6/2019 | |
| WO | 0024050 | 4/2000 | |

OTHER PUBLICATIONS

CAS Abstract of RN 959027-48-6 (20, Dec. 2007) (Year: 2007).*
F. Franke, et al. 44 The Journal of Organic Chemistry, 4055-4060 (1979) (Year: 1979).*
CAS Abstract of RN 959038-00-7 (Year: 2007).*
NIST Standard Reference—2010 (Year: 2010).*
CAS Abstract RN 959258-73-2 (Year: 2007).*
CAS Abstract-RN 73363-26-5 (Year: 2009).*
Grill, A. Patel, V., Ultralow-k dielectrics prepared by plasma-enhanced chemical vapor deposition, Appl. Phys. Lett., (2001), 79(6), pp. 803-805.
International Search Report for PCT/US99/24910.

* cited by examiner

*Primary Examiner* — Alexander R Pagano
*Assistant Examiner* — Frank S. Hou
(74) *Attorney, Agent, or Firm* — David K. Benson

(57) ABSTRACT

A method and composition for producing a porous low k dielectric film via chemical vapor deposition includes the steps of: providing a substrate within a reaction chamber; introducing into the reaction chamber gaseous reagents including at least one structure-forming precursor comprising an silacyclic compound, and with or without a porogen; applying energy to the gaseous reagents in the reaction chamber to induce reaction of the gaseous reagents to deposit a preliminary film on the substrate, wherein the preliminary film contains the porogen, and the preliminary film is deposited; and removing from the preliminary film at least a portion of the porogen contained therein and provide the film with pores and a dielectric constant of 3.0 or less. In certain embodiments, the structure-forming precursor further comprises a hardening additive.

14 Claims, No Drawings

SILACYCLIC COMPOUNDS AND METHODS FOR DEPOSITING SILICON-CONTAINING FILMS USING SAME

CROSS-REFERENCE OF RELATED APPLICATIONS

This application is a divisional of U.S. application Ser. No. 16/170,152, filed Oct. 25, 2018; which claims the benefit of priority to U.S. provisional application Ser. No. 62/578,072, filed Oct. 27, 2017. Both applications are incorporated herein by reference in their entirety.

BACKGROUND OF THE INVENTION

Described herein are compositions and methods for the formation of dielectric films using silacyclic compounds as a structure forming precursor(s). More specifically, described herein are compositions and methods for forming a porous low dielectric constant ("low k" film or film having a dielectric constant of about 3.0 or less) film wherein the method used to deposit the film is a chemical vapor deposition (CVD) method. The dielectric films produced by the compositions and methods described herein can be used, for example, as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.7 to about 3.5. This organosilica glass is typically deposited as a dense film (density~1.5 $g/cm^3$) from an organosilicon precursor, such as a methylsilane or siloxane, and an oxidant, such as $O_2$ or $N_2O$. Organosilica glass will be herein be referred to as OSG. As dielectric constant or "k" values drop below 2.7 with higher device densities and smaller dimensions, the industry has exhausted most of the suitable low k compositions for dense films and has turned to various porous materials for improved insulating properties.

Patents, published applications, and publications in the field of porous ILD by CVD methods field include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Lett. (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In the latter references, the ultimate final composition of the films indicate residual porogen and a high hydrocarbon film content of approximately 80 to 90 at. %. Further, the final films retain the $SiO_2$-like network, with substitution of a portion of oxygen atoms for organic groups.

A challenge, which has been recognized in the industry, is that films with lower dielectric constants typically have higher porosity, which leads to enhanced diffusion of species into the films, specifically gas phase diffusion. This increased diffusion can result in increased removal of carbon from the porous OSG film from processes such as etching of the film, plasma ashing of photoresist, and $NH_3$ plasma treatment of copper surfaces. Carbon depletion in the OSG films can cause one or more of the following problems: an increase in the dielectric constant of the film; film etching and feature bowing during wet cleaning steps; moisture absorption into the film due to loss of hydrophobicity, pattern collapse of fine features during the wet clean steps after pattern etch and/or integration issues when depositing subsequent layers such as, without limitation, copper diffusion barriers, for example Ta/TaN or advanced Co or MnN barrier layers.

Possible solutions to one or more of these problems are to use porous OSG films with increased carbon content. A first approach is to use a porogen which results in a higher retention of Si-Methyl (Me) groups in the porous OSG layer. Unfortunately increasing Si-Me content typically leads to decreasing mechanical properties, thus the films with more Si-Me groups will negatively impact mechanical strength which is important for integration in fabrication of devices. A second approach has been to use a damage resistant porogen (DRP), such as, for example, the porogen disclosed in U.S. Pat. No. 8,753,985, which leaves additional amorphous carbon behind in the film after UV curing. In certain cases, this residual carbon does not negatively impact the dielectric constant nor the mechanical strength. It is difficult, however, to get significantly higher carbon contents in these films using the DRP.

Yet another solution proposed has been to use ethylene or methylene bridged disiloxanes of the general formula $R_x(RO)_{3-x}Si(CH_2)_ySiR_z(OR)_{3-z}$ where x=0-3, y=1 or 2, z=0-3. The use of bridged species is believed to avoid the negative impact to the mechanical strength by replacing bridging oxygen with a bridging carbon chain since the network connectivity will remain the same. This arises from the belief that replacing bridging oxygen with a terminal methyl group will lower mechanical strength by lowering network connectivity. In this manner, one can replace an oxygen atom with 1-2 carbon atoms to increase the atomic weight percent (%) C without lowering mechanical strength. These bridged precursors, however, generally have very high boiling points due to the increased molecular weight from having two silicon groups. The increased boiling point may negatively impact the manufacturing process by making it difficult to deliver the chemical precursor into the reaction chamber as a gas phase reagent without condensing it in the vapor delivery line or process pump exhaust.

Thus, there is a need in the art for a dielectric precursor that provides a film with increased carbon content upon deposition yet does not suffer the above-mentioned drawbacks.

BRIEF SUMMARY OF THE INVENTION

The above-described needs and others are met by a method for producing a dielectric film represented by the formula $Si_vO_wC_xH_yF_z$, wherein v+w+x+y+z=100%, v is from 10 to 35 at. %, w is from 10 to 65 at. %, x is from 5 to 40 at. %, y is from 10 to 50 at. % and z is from 0 to 15 at. %. According to the method, a substrate is provided within a reaction chamber, and gaseous reagents including at least one structure-forming precursor comprising an silacyclic compound are introduced therein. The silacyclic compound preferably contains less than about 100 ppm of impurities. Energy is then applied to the gaseous reagents in the reaction chamber to induce reaction of the gaseous reagents and thereby deposit a preliminary film on the substrate.

The above-described needs and others are further met by a similar method in which a porogen is introduced in the reaction chamber with the gaseous reagents that include at least one structure-forming precursor comprising an silacyclic compound. In such a method, the preliminary film includes the porogen. The method further includes the step of removing from the preliminary film at least a portion of the porogen to provide the porous dielectric film comprising pores and having a dielectric constant of about 2.6 or less.

The silacyclic compound(s) may include 1-methyl-1-acetoxysilacyclopentane (MASCAP), as a structure former, which after UV curing provides a film that has similar mechanical properties as the films that use a prior art structure former such as diethoxymethylsilane (DEMS) at the same dielectric constant. Further, the films deposited using the silacyclic compounds described herein as the structure forming precursor(s) comprise a relatively higher amount of carbon. In addition, the silacyclic compound(s) described herein have a lower molecular weight (Mw) relative to other prior art structure-forming precursors such as bridged precursors, (e.g., alkoxydisiloxane precursors) which by nature of having 2 silicon groups have a higher MW and higher boiling points, thereby making the silacyclic precursors described herein more convenient to process, for example, in a high volume manufacturing process.

In certain embodiments, the film comprises a higher carbon content (10-40 at. %) as measured by X-ray photospectrometry (XPS) and exhibits a decreased depth of carbon removal when exposed to, for example an $O_2$ or $NH_3$ plasma as measured by examining the carbon content determined by XPS depth profiling.

DETAILED DESCRIPTION OF THE INVENTION

Described herein is a chemical vapor deposition (CVD) method for producing a low k dielectric film, the method comprising: providing a substrate within a reaction chamber; introducing into the reaction chamber gaseous reagents including at least one structure-forming precursor comprising an silacyclic compound such as, for example, 1-methyl-1-acetoxy-1-silacyclopentane; applying energy to the gaseous reagents in the reaction chamber to induce reaction of the gaseous reagents to deposit a preliminary film on the substrate, wherein the preliminary film can be subsequently UV cured to improve mechanical properties. The as deposited or UV cured film will have a dielectric constant of 3.3 or less, preferably 3.0 or less, most preferably 2.9 or less.

The silacyclic compounds described herein provide unique attributes that make it possible for one to incorporate more carbon content in the dielectric film with little, if any, impact on the mechanical properties of the dielectric film compared to prior art structure forming precursors such as diethoxymethylsilane (DEMS). For example, DEMS provides a mixed ligand system in DEMS with two alkoxy groups, one methyl and one hydride which offers a balance of reactive sites and allows for the formation of more mechanically robust films while retaining the desired dielectric constant desired. While not being bound by theory, the silacyclic precursors described herein such as 1-methyl-1-acetoxy-1-silacyclopentane are asymmetric in nature and may offer advantages over more symmetric precursors such as 1,1-dimethyl-1-silacyclopentane or 1,1-diethoxy-1-silacyclopent-3-ene, or 1,1-diethoxy-1-silacyclopentane which have been disclosed in prior art. The incorporation of one alkyl and one alkoxy group of the structure-forming precursor(s) described herein allows for a balance of mechanical strength and carbon incorporation at dielectric constant of 3.3 or less.

In certain embodiments of the method and composition described herein, a layer of silicon-containing dielectric material is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semiconductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In certain embodiments of the method described herein, the layer of silicon-containing dielectric material is deposited on at least a portion of the substrate by introducing into the reaction chamber gaseous reagents including at least one structure-forming precursor comprising an silacyclic compound.

In certain embodiments a second structure forming precursor can be added as a hardening additive to enhance the films mechanical properties. This film can be used as deposited, or UV cured to further improve mechanical properties.

The methods and compositions described herein use an silacyclic compound as the structure-forming precursor(s) according which have the following structure of Formula (I):

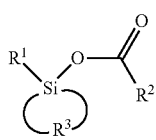

(I)

wherein $R^1$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, a $C_3$ to $C_{10}$ hetero-aryl group; $R^2$ is selected from hydrogen, a linear or branched $C_1$ to $C_{10}$ alkyl group, a linear or branched $O_2$ to $C_{10}$ alkenyl group, a linear or branched $O_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl or aralkyl group, a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom.

In the formula above and throughout the description, the term "alkyl" denotes a linear or branched functional group having from 1 to 10 carbon atoms. Exemplary linear alkyl groups include, but are not limited to, methyl, ethyl, n-propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group such as methoxy, ethoxy, iso-propoxy, and n-propoxy, a dialkylamino group such as dimethylamino or combinations thereof, attached thereto. In other embodiments, the alkyl group does not have one or more functional groups attached thereto. The alkyl group may be saturated or, alternatively, unsaturated.

In Formula I above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In Formula I above and throughout the description, the term "hetero-cyclic" denotes a $C_2$ to $C_{10}$ hetero-cyclic alkyl group such as an epoxy group.

In Formula I above and throughout the description, the term "alkenyl group" denotes a group which has one or more carbon-carbon double bonds and has from 2 to 10 or from 2 to 10 or from 2 to 6 carbon atoms.

In Formula I above and throughout the description, the term "alkynyl group" denotes a group which has one or more carbon-carbon triple bonds and has from 3 to 10 or from 2 to 10 or from 2 to 6 carbon atoms.

In Formula I above and throughout the description, the term "aryl or aralkyl" denotes an aromatic or alkyl substituted aromatic functional group having from 5 to 10 carbon atoms, or from 6 to 10 carbon atoms. Exemplary aryl groups include, but are not limited to, phenyl, tolyl, and o-xylyl.

In Formula I above and throughout the description, the term "alkylaryl" denotes an alkyl-substituted aryl as defined above. Exemplary alkaryl groups include, but are not limited to, benzyl and chlorobenzyl.

In Formula I above and throughout the description, the term "hetero-aryl" denotes a $C_3$ to $C_{10}$ hetero-cyclic aryl group including, but not limited to, 1,2,3-triazolyl, pyrrrolyl, and furanyl.

In Formula I above, substituent $R^3$ is a $C_3$ to $C_{10}$ alkyl di-radical which forms a four-membered, five-membered, or six-membered cyclic ring with the Si atom. As the skilled person will understand, $R^3$ is a substituted or unsubstituted hydrocarbon chain which links with the Si atom together to form a ring in Formula I wherein the ring is a four-membered, five-membered, or six-membered ring. In these embodiments, the ring structure can be saturated such as, for example, a cyclic alkyl ring, or unsaturated, for example, an aryl ring.

In certain embodiments of Formula I, $R^1$ is selected from the group consisting of hydrogen, methyl, and ethyl, $R^2$ is selected from the group consisting of methyl, ethyl, and isopropyl, and $R^3$ forms a four-membered, five-membered, or six-membered cyclic ring with the Si atom. Examples of these embodiments are as follows:

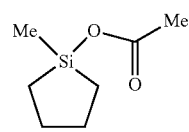

1-methyl-1-acetoxy-1-silacyclopentane

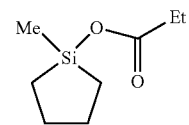

1-methyl-1-propionoxy-1-silacyclopentane

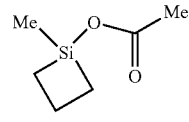

1-methyl-1-acetoxy-1-silacyclobutane

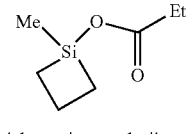

1-methyl-1-propionoxy-1-silacyclobutane

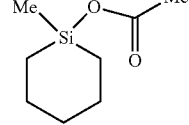

1-methyl-1-acetoxy-1-silacyclohexane

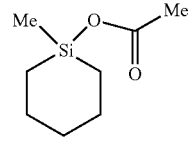

1-methyl-1-propionoxy-1-silacyclohexane

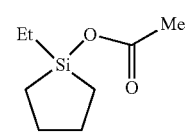

1-ethyl-1-acetoxy-1-silacyclopentane

-continued

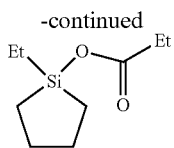

1-ethyl-1-propionoxy-1-silacyclopentane

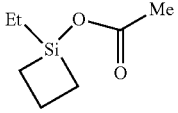

1-ethyl-1-acetoxy-1-silacyclobutane

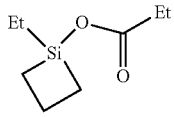

1-ethyl-1-propionoxy-1-silacyclobutane

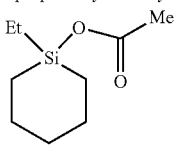

1-ethyl-1-acetoxy-1-silacyclohexane

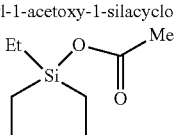

1-ethyl-1-propionoxy-1-silacyclohexane

In one particular embodiment, the composition and method described herein uses the silacyclic compound, 1-methyl-1-acetoxysilacyclopentane (MASCAP), as the structure-forming precursor which has the following structure:

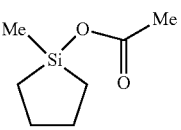

The silacyclic compounds described herein and methods and compositions comprising same are preferably substantially free of one or more impurities such as without limitation, halide ions and water. As used herein, the term "substantially free" as it relates to an impurity means 100 parts per million (ppm) or less, 50 ppm or less, 10 ppm or less, and 5 ppm or less of the impurity. As used herein, the term "free of" as it relates to an impurity means 0.1 parts per million (ppm) or less. The impurity includes, but is not limited to, halides, metal ions, volatile metal compounds, chlorosilicon-containing compounds, silicon-containing compounds.

In one particular embodiment, the silacyclic compounds are preferably substantially free of halide-containing compounds. As used herein, the term "substantially free" as it relates to halide ions (or halides) such as, for example, chlorides (i.e. chloride-containing compounds such as HCl or silicon compounds having at least one Si—Cl bond) and fluorides, bromides, and iodides, means less than 5 ppm of halides (by weight) measured by ion chromatography (IC), preferably less than 3 ppm measured by ion chromatography (IC), and more preferably less than 1 ppm measured by ion chromatography (IC), and most preferably 0 ppm measured by ion chromatography (IC). Chlorides are known to act as decomposition catalysts for the silacyclic compounds. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The silacyclic compounds are preferably substantially free of metal ions such as, $Li^+$, $Mg^{2+}$, $Ca^{2+}$, $Al^{3+}$, $Fe^{2+}$, $Fe^{3+}$, $Ni^{2+}$, $Cr^{3+}$. As used herein, the term "substantially free" as it relates to Li, Al, Fe, Ni, Cr, Mg, and Ca means less than 5 ppm (by weight), preferably less than 3 ppm, and more preferably less than 1 ppm, and most preferably 0.1 ppm as measured by Inductively coupled plasma mass spectrometry (ICP-MS). In some embodiments, the silicon precursor compounds having Formula A are free of metal ions such as, $Li^+$, $Mg^{2+}$, $Ca^{2+}$, $Al^{3+}$, $Fe^{2+}$, $Fe^{3+}$, $Ni^{2+}$, $Cr^{3+}$. As used herein, the term "free of" metal impurities as it relates to Li, Mg, Ca, Al, Fe, Ni, Cr, noble metal such as volatile Ru or Pt complexes from ruthenium or platinum catalysts used in the synthesis, means less than 1 ppm or less, preferably 0.1 ppm or less (by weight) as measured by ICP-MS.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be introduced during synthesis due to using reagents that do contain halides such as trichloromethylsilane, tribromosilane thereby avoiding the production of by-products that contain halide. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and may include, but are not limited to, purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO—Al_2O_3$ blends can be used to remove halides such as chloride.

Whereas prior art silicon-containing structure-forming precursors such as, for example, DEMS polymerize once energized in the reaction chamber to form a structure having an —O— linkage (e.g., —Si—O—Si— or —Si—O—C—) in the polymer backbone, it is believed that silacyclic compounds, such as, for example, the MASCAP molecule polymerizes to form a structure where, some of the —O— bridge in the backbone is/are replaced with a —CH$_2$— methylene or —CH$_2$CH$_2$— ethylene bridge(s). In films deposited using DEMS as the structure forming precursor where the carbon exists mainly in the form of terminal Si-Me groups, there is a relationship between the % Si-Me (directly related to % C) versus mechanical strength, where the replacement of a bridging Si—O—Si group with two terminal Si-Me groups decreases the mechanical properties because the network structure is disrupted. Without intending to be bound by a particular theory, in the case of the alkyl-alkoxysilacyclic compounds, it is believed that the cyclic structure is broken either during the film deposition or the cure process (to remove at least a portion of, or substantially all, of the porogen precursor contained in the as-deposited film) to form $SiCH_2Si$ or $SiCH_2CH_2Si$ bridging groups. In this manner, one can incorporate carbon in the form of a bridging group so that, from a mechanical strength view, the network structure is not disrupted by increasing the carbon content. Without intending to be bound by a particular theory, it is believed that this attribute adds carbon to the film, which allows the film to be more resilient to carbon depletion of the porous OSG film from processes such as etching of the film, plasma ashing of photoresist, and $NH_3$ plasma treatment of copper surfaces. Carbon depletion in the OSG films can cause increases in the defective dielectric constant of the film, problems with film etching and feature bowing during wet cleaning steps, and/or integration issues when depositing copper diffusion barriers.

In certain embodiments of the methods and compositions disclosed herein, an additional structure forming precursor further comprises a hardening additive which will increase the mechanical strength when used with silacyclic structure former, examples of hardening additives are tetraalkoxysilanes, such as for example, tetrethoxysilane (TEOS) or tetramethoxysilane (TMOS). In embodiments wherein a hardening additive is used, the composition of the structure forming portion comprises from about 30 to about 95 weight percent structure forming precursor comprising the silacyclic compound(s) having Formula I; from about 5 to about 70 weight percent of hardening additive; and about 40 to about 95 weight percent of the total precursor flow of porogen precursor.

In a further embodiment the gaseous reagents further comprise one or more porogen precursors which is introduced into the reaction chamber along with the at least one structure-forming precursor comprising an silacyclic compound such as, for example, 1-methyl-1-acetoxysilacyclopentane. The following are non-limiting examples of materials suitable for use as porogens for use according to the present invention:

1) Cyclic hydrocarbons of the general formula $C_nH_{2n}$ where n=4–14, where the number of carbons in the cyclic structure is between 4 and 10, and where there can be a plurality of simple or branched hydrocarbons substituted onto the cyclic structure. Examples include: cyclohexane, 1,2,4-trimethylcyclohexane, 1-methyl-4-(1-methylethyl)cyclohexane, cyclooctane, methylcyclooctane, methylcyclohexane, etc.

2) Linear or branched, saturated, singly or multiply unsaturated hydrocarbons of the general formula $C_nH_{(2n+2)-2y}$ where n=2–20 and where y=0–n. Examples include: ethylene, propylene, acetylene, neohexane, 1,3-butadiene, 2-methyl-1,3-butadiene, 2,3-dimethyl-2,3-butadiene, substituted dienes, etc.

3) Singly or multiply unsaturated cyclic hydrocarbons of the general formula $C_nH_{2n-2x}$ where x is the number of unsaturated sites in the molecule, n=4–14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure. Examples include, para-cymene, cyclooctene, 1,5-cyclooctadiene, dimethyl-cyclooctadiene, cyclohexene, vinyl-cyclohexane, dimethylcyclohexene, alpha-terpinene, pinene, limonene, vinyl-cyclohexene, etc.

4) Bicyclic hydrocarbons of the general formula $C_nH_{2n-2}$ where n=4–14, where the number of carbons in the bicyclic structure is between 4 and 12, and where there can be a plurality of simple or branched hydrocarbons substituted onto the cyclic structure. Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4–14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure. Examples include camphene, norbornene, norbornadiene, 5-Ethylidene-2-norbornene etc.

6) Tricyclic hydrocarbons of the general formula $C_nH_{2n-4}$ where n=4–14, where the number of carbons in the tricyclic structure is between 4 and 12, and where there can be a plurality of simple or branched hydrocarbons substituted onto the cyclic structure. Examples include adamantane.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In addition to the structure forming species and the pore-forming species, additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as oxygen-containing species such as, for example, $O_2$, $O_3$, and $N_2O$, gaseous or liquid organic substances, $NH_3$, $H_2$, $CO_2$, or CO. In one particular embodiment, the reaction mixture introduced into the reaction chamber comprises at least one oxidant selected from the group consisting of 02, $N_2O$, NO, $NO_2$, $CO_2$, water, $H_2O_2$, ozone, and combinations thereof. In an alternative embodiment, the reaction mixture does not comprise an oxidant.

Energy is applied to the gaseous reagents to induce the gases to react and to form the film on the substrate. Such energy can be provided by, e.g., plasma, pulsed plasma, helicon plasma, high density plasma, inductively coupled plasma, remote plasma, hot filament, and thermal (i.e., non-filament) methods. A secondary rf frequency source can be used to modify the plasma characteristics at the substrate surface. Preferably, the film is formed by plasma enhanced chemical vapor deposition ("PECVD").

The flow rate for each of the gaseous reagents preferably ranges from 10 to 5000 sccm, more preferably from 30 to 1000 sccm, per single 200 mm wafer. The actual flow rates needed may depend upon wafer size and chamber configuration, and are in no way limited to 200 mm wafers or single wafer chambers.

In certain embodiments, the film is deposited at a deposition rate of about 50 nanometers (nm) per minute.

The pressure in the reaction chamber during deposition ranges from about 0.01 to about 600 torr (1.3 Pa-80 kPa) or from about 1 to 15 torr (130 Pa-2 kPa).

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

Preferred embodiments of the invention provide a thin film material having a low dielectric constant and improved mechanical properties, thermal stability, and chemical resistance (to oxygen, aqueous oxidizing environments, etc.) relative to other low k dielectric films deposited using other structure forming precursors known in the art. In preferred embodiments the structure forming precursors described herein comprising the silacyclic compound(s) having Formula I provide a higher incorporation into the film of carbon (preferably predominantly in the form of organic carbon, —$CH_x$, where x is 1 to 3) whereby specific precursor or network-forming chemicals are used to deposit films. In certain embodiments, the majority of the hydrogen in the film is bonded to carbon.

The low k dielectric film deposited using the composition and method described herein preferably comprise: (a) about 10 to about 35 at. %, more preferably about 20 to about 30 at. % silicon; (b) about 10 to about 65 at. %, more preferably about 20 to about 45 at. % oxygen; (c) about 10 to about 50 at. %, more preferably about 15 to about 40 at. % hydrogen; (d) about 5 to about 40 at. %, more preferably about 10 to about 45 at. % carbon. The low k dielectric film may also include about 0.1 to about 15 at. %, more preferably about 0.5 to about 7.0 at. % fluorine, to improve one or more materials properties. Lesser portions of other elements may also be present in certain films of the invention. OSG materials are considered to be low k materials as their dielectric constant is less than that of the standard material traditionally used in the industry—silica glass. The materials of the invention can also be provided by adding pore-forming species or porogens to the deposition procedure, incorporating the porogens into the as-deposited (i.e., preliminary) OSG film and removing substantially all of the porogens from the preliminary film while substantially retaining the terminal Si—$CH_3$ groups or bridging —$(CH_2)_x$— of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic $SiO_2$, which lacks the hydrophobicity provided by the organic groups in OSG.

Films of the invention may also contain fluorine in the form of inorganic fluorine (e.g., Si—F). Fluorine, when present, is preferably contained in an amount ranging from 0.5 to 7 at. %.

Films of the present development are preferably thermally stable, with good chemical resistance. In particular, preferred films after an anneal step have an average weight loss of less than 1.0 wt %/hr isothermal at 425° C. under $N_2$. Moreover, the films preferably have an average weight loss of less than 1.0 wt %/hr isothermal at 425° C. under air.

The films disclosed herein are suitable for a variety of uses. The films are particularly suitable for deposition on a semiconductor substrate, and are particularly suitable for use as, e.g., an insulation layer, an interlayer dielectric layer and/or an inter-metal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an inter-metal dielectric layer, a capping layer, a chemical-mechanical planarization (CMP) or etch stop layer, a barrier layer or an adhesion layer in an integrated circuit.

Although the films described herein are uniformly deposited dielectric films, the films as used in a full integration structure may actually consist of several sandwiched layers with for example a thin layer at the bottom or top which contains silicon oxide like properties. These sandwich layers may be utilized to enhance secondary integration properties such as for example adhesion, etch selectivity or electromigration performance.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583,049, which is hereby incorporated by reference.

Compositions of the invention can further comprise, e.g., at least one pressurizable vessel (preferably of stainless steel) fitted with the proper valves and fittings to allow the delivery of porogen, and MASCAP precursor to the process reactor. The contents of the vessel(s) can be premixed. Alternatively, multiple structure forming precursors can be maintained in separate vessels or in a single vessel having separation means for maintaining the porogen and precursor separate during storage. Such vessels can also have means for mixing the porogen and precursor when desired.

The conditions under which post-treatment are conducted can vary greatly. For example, post-treating can be conducted under high pressure or under a vacuum ambient.

UV annealing is a preferred method conducted preferably under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr (130 Pa-130 kPa), more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total UV annealing time is preferably from 0.01 min to 12 hours.

Chemical treatment of the OSG film is preferably conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film is preferably conducted under the following conditions.

The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for selective removal of labile groups and possible chemical modification of the OSG film is preferably conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mTorr (1.3 Pa) to atmospheric pressure. The total curing time is preferably 0.01 min to 12 hours.

UV curing for selective removal of porogens from an organosilicate film is preferably conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths<200 nm). The total UV curing time is preferably 0.01 min to 12 hours.

Microwave post-treatment for selective removal of porogens from an organosilicate film is preferably conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of porogens or specific chemical species from an organosilicate film and/or improvement of film properties is preferably conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Example, but it should be understood that it is not deemed to be limited thereto.

EXAMPLES

Exemplary films were deposited on 200 mm wafers via a plasma enhanced CVD (PECVD) process using an Applied Materials Precision-5000 system in a 200 mm DxZ reaction chamber or vacuum chamber that was fitted with an Advance Energy 200 RF generator from a variety of different chemical precursors and process conditions. The PECVD process generally involved the following basic steps: initial set-up and stabilization of gas flows, deposition of the film onto the silicon wafer substrate, and purge/evacuation of chamber prior to substrate removal. After the deposition, some films were subjected to UV annealing. UV annealing was performed using a Fusion UV system with a broad band UV bulb, with the wafer held under a helium gas flow at one or more pressures<10 torr (1.3 kPa) and at one or more temperatures<400° C. The experiments were conducted on p-type Si wafers (resistivity range=8-12 Ohm-cm).

Thickness and refractive index were measured on an SCI FilmTek 2000 Reflectometer. Dielectric constants were determined using Hg probe technique on mid-resistivity p-type wafers (range 8-12 ohm-cm). FTIR spectra were measured using a Nicholet Nexxus 470 spectrometer. In Example 1 mechanical properties were determined using MTS Nano Indenter. Compositional data were obtained by x-ray photoelectron spectroscopy (XPS) on a Physical Electronics 5000LS and are provided in atomic weight percent. The atomic weight percent % values reported do not include hydrogen.

Example 1: Deposition of OSG Films from 1-methyl-1-acetoxy-1-silacyclopentane

An organosilicate layer was deposited using 1-acetoxy-1-methyl-1-silacyclopentane as a silicon precursor. The deposition conditions for depositing the composite film on a 200 mm wafer are as follows: The precursor was delivered to the reaction chamber via direct liquid injection (DLI) at a flow rate of 1000 milligrams/minute (mg/min) of 1-methyl-1-acetoxy-1-silacyclopentane, 200 standard cubic centimeters per minute (sccm) helium carrier gas flow, 20 sccm $O_2$, 350 milli-inch (0.89 cm) showerhead/wafer spacing, 400° C. wafer chuck temperature, 7 Torr (930 Pa) chamber pressure to which a 650 W plasma was applied for 80 seconds. The resulting as deposited film was 499 nm thick and had a Refractive Index (RI) of 1.486. This film as deposited had a dielectric constant of 2.96, an elastic modulus of 13.5 GPa, and a hardness of 2.4 GPa. After deposition the film was exposed to a UV annealing step for a period of 4 minutes at 400° C. After UV annealing the film had shrunk 7.6% to 461 nm thick with a refractive index of 1.488. After UV curing the film had a dielectric constant of 3.00, an elastic modulus of 16.8 GPa, and a hardness of 3.2 GPa. The elemental composition of the film after UV annealing as measured by XPS was 27.1 at. % carbon, 42.6 at. % oxygen and 30.3 at. % silicon. Although XPS analysis cannot measure hydrogen composition in such a film, it is expected that hydrogen is present in the form of C—H bonding and possibly Si—H bonding and would constitute between 10 and 50 at. % of the film.

The invention claimed is:

1. A composition for producing a dielectric film represented by the formula $Si_vO_wC_xH_yF_z$, wherein v+w+x+y+z=100%, v is from 10 to 35 at. %, w is from 10 to 65 at. %, x is from 5 to 40 at. %, y is from 10 to 50 at. % and z is from 0 to 15 at. %, said composition comprising at least one structure-forming precursor comprising a silacyclic compound having the following Formula I:

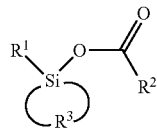

(I)

wherein $R^1$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl or aralkyl group, and a $C_3$ to $C_{10}$ hetero-aryl group; $R^2$ is selected from methyl, a branched $C_3$ to $C_{10}$ alkyl group, a $C_3$ to $C_{10}$ cyclic alkyl group, a $C_3$ to $C_{10}$ hetero-cyclic alkyl group, a $C_5$ to $C_{10}$ aryl or aralkyl group, and a $C_3$ to $C_{10}$ hetero-aryl group; and $R^3$ is selected from a linear $C_4$ to $C_5$ di-radical which forms a five-membered, or six-membered saturated cyclic ring with the Si atom.

2. The composition of claim 1 further comprising a hardening additive selected from the group consisting of tetraethoxysilane and tetramethoxysilane.

3. The composition of claim 1 wherein the silacyclic compound comprises at least one compound selected from the group consisting of 1-methyl-1-acetoxy-1-silacyclopentane, 1-methyl-1-acetoxy-1-silacyclohexane, 1-ethyl-1-acetoxy-1-silacyclopentane, 1-ethyl-1-acetoxy-1-silacyclohexane, and combinations thereof.

4. The composition of claim 3 wherein the silacyclic compound comprises 1-methyl-1-acetoxy-1-silacyclopentane.

5. The composition of claim 1 wherein the composition is substantially free of any impurity selected from the group consisting of halides, metals, and water.

6. The composition of claim 5 wherein the composition has less than 100 ppm of the impurity.

7. The composition of claim 6 wherein the composition has less than 50 ppm of the impurity.

8. The composition of claim 7 wherein the composition has less than 10 ppm of the impurity.

9. The composition of claim 8 wherein the composition has less than 5 ppm of the impurity.

10. The composition of claim 9 wherein the composition has less than 3 ppm of any halides as measured by ion chromatography.

11. The composition of claim 9 wherein the composition has less than 0.1 ppm of any metal ions as measured by inductively coupled plasma mass spectrometry.

12. The composition of claim 1, further comprising a porogen.

13. The composition of claim 12, wherein the porogen is at least one compound selected from the group consisting of:
cyclic hydrocarbons of the general formula $C_nH_{2n}$ where n=4-14, wherein the number of carbons in the cyclic structure is between 4 and 10, and wherein one or more simple or branched hydrocarbon substituents are optionally present on the cyclic structure;
linear or branched, saturated, singly or multiply unsaturated hydrocarbons of the general formula $C_nH_{(2n+2)-2m}$ wherein n=2-20 and m=0-n;
singly or multiply unsaturated cyclic hydrocarbons of the general formula $C_nH_{2n-2p}$ wherein p is the number of unsaturated sites in the molecule, n=4-14, the number of carbons in the cyclic structure is between 4 and 10, and wherein one or more simple or branched hydrocarbon substituents are optionally present on o the cyclic structure;
bicyclic hydrocarbons of the general formula $C_nH_{2n-2}$ wherein n=4-14, the number of carbons in the bicyclic structure is between 4 and 12, and wherein one or more simple or branched hydrocarbon substituents are optionally present on the cyclic structure;
multiply unsaturated bicyclic hydrocarbons of the general formula $C_nH_{2n-(2+2m)}$ wherein m is the number of unsaturated sites in the molecule, n=4-14, the number of carbons in the bicyclic structure is between 4 and 12, and wherein one or more simple or branched hydrocarbon substituents are optionally present on the cyclic structure; and
tricyclic hydrocarbons of the general formula $C_nH_{2n-4}$ wherein n=4-14, the number of carbons in the tricyclic structure is between 4 and 12, and wherein one or more simple or branched hydrocarbon substituents are optionally present on the cyclic structure.

14. The composition of claim 13 wherein the porogen comprises at least one compound selected from the group consisting of cyclohexane, 1,2,4-trimethylcyclohexane, 1-methyl-4-(1-methylethyl) cyclohexane, cyclooctane, methylcyclooctane, ethylene, propylene, acetylene, neohexane, 1,3-butadiene, 2-methyl-1,3-butadiene, 2,3-dimethyl-2,3-butadiene, substituted dienes, para-cymene, cyclooctene, 1,5-cyclooctadiene, cyclohexene, vinyl-cyclohexane, dimethylcyclohexene, alpha-terpinene, pinene, limonene, vinyl-cyclohexene, norbornane, spiro-nonane, camphene, norbornene, norbornadiene, 5-ethylidene-2-norbornene, decahydronaphthalene, and adamantane.

* * * * *